(12) United States Patent
Hammouda et al.

(10) Patent No.: US 7,730,433 B2
(45) Date of Patent: Jun. 1, 2010

(54) ANALOG DESIGN RETARGETING

(76) Inventors: Sherif Ahmed Abdel-Wahab Hammouda, 51 Beirut St. Heliopolis, Cairo 11341 (EG); Mohamed Amin Ibrahim Dessouky, 51 Beirut St. Heliopolis, Cairo 11341 (EG); Mohamed Sameh Tawfik, 51 Beirut St. Heliopolis, Cairo 11341 (EG)

(*) Notice: Subject to any disclaimer, the term of this patent is extended or adjusted under 35 U.S.C. 154(b) by 11 days.

(21) Appl. No.: 10/554,139

(22) PCT Filed: Sep. 29, 2005

(86) PCT No.: PCT/EP2005/054928

§ 371 (c)(1),
(2), (4) Date: Feb. 1, 2008

(87) PCT Pub. No.: WO2007/038984

PCT Pub. Date: Apr. 12, 2007

(65) Prior Publication Data

US 2008/0134109 A1 Jun. 5, 2008

(51) Int. Cl.
*G06F 17/50* (2006.01)
(52) U.S. Cl. ................................. 716/3; 716/1; 716/2
(58) Field of Classification Search ............... 716/1–3
See application file for complete search history.

(56) References Cited

U.S. PATENT DOCUMENTS 7,409,651 B2 * 8/2008 Berger et al. .................. 716/3
2005/0028113 A1 2/2005 Lin et al.
2006/0101357 A1 * 5/2006 Allen et al. .................. 716/3
2007/0033550 A1 * 2/2007 Berger et al. ................. 716/3

OTHER PUBLICATIONS

Funaba et al., "A Fast and Accurate Method of Redesigning Analog Subcircuits for Technology Scaling," *1998 Design Automation Conference*, pp. 489-494 (Feb. 10, 1998).
Hammouda et al., "Analog IP Migration Using Design Knowledge Extraction," *IEEE 2004 Custom Integrated Circuits Conference*, pp. 333-336 (Oct. 3, 2004).
Phelps et al., "A Case Study of Synthesis for Industrial-Scale Analog IP: Redesign of the Equalizer/Filter Frontend for an ADSL Codec," *37th Annual Design Automation Conference*, pp. 1-6 (Jun. 5, 2000).
Xu Jinghan et al., "IC Design Automation from Circuit Level Optimization to Retargetable Layout," *Electronics, Circuits and Systems, ICECS 2001*, pp. 95-98 (Sep. 2, 2001).
International Search Report and Written Opinion for International Application No. PCT/EP2005/054928 (Sep. 29, 2005).

(Continued)

*Primary Examiner*—Sun J Lin
(74) *Attorney, Agent, or Firm*—Klarquist Sparkman, LLP

(57) ABSTRACT

An analog retargeting system and method are disclosed for converting a circuit from a source technology to a target technology. Thus, an analog circuit in a source technology can be converted to another technology while maintaining substantially the same circuit behavior and specifications as the original design. The conversion includes analyzing and resizing the circuit at the device level. For example, the analysis may include determining a mode of operation for a transistor and resizing the transistor based on the mode of operation. In another example, the analysis may include determining node voltages coupled to a device and the resizing strategy may be adjusted based on the determined node voltages.

16 Claims, 15 Drawing Sheets

OTHER PUBLICATIONS

Dessouky, M. et al., "Analog IP Design Retargeting based on Design Extraction and Transistor Optimization," Oct. 2004, 17 pgs.

Hammouda, S. et al., "A Fully Automated Approach for Analog Circuit Reuse," Jul. 2004, 4 pgs.

* cited by examiner

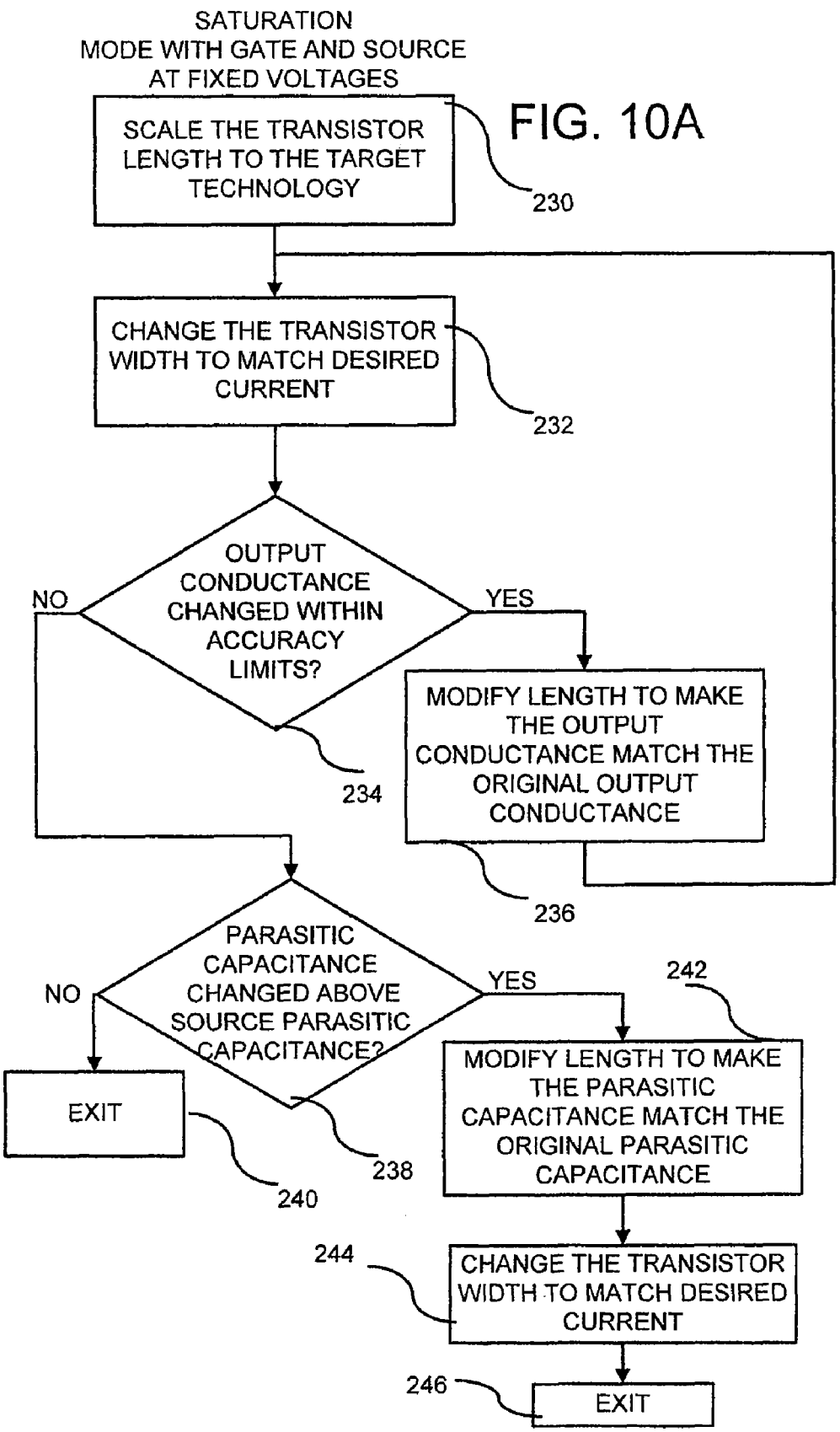

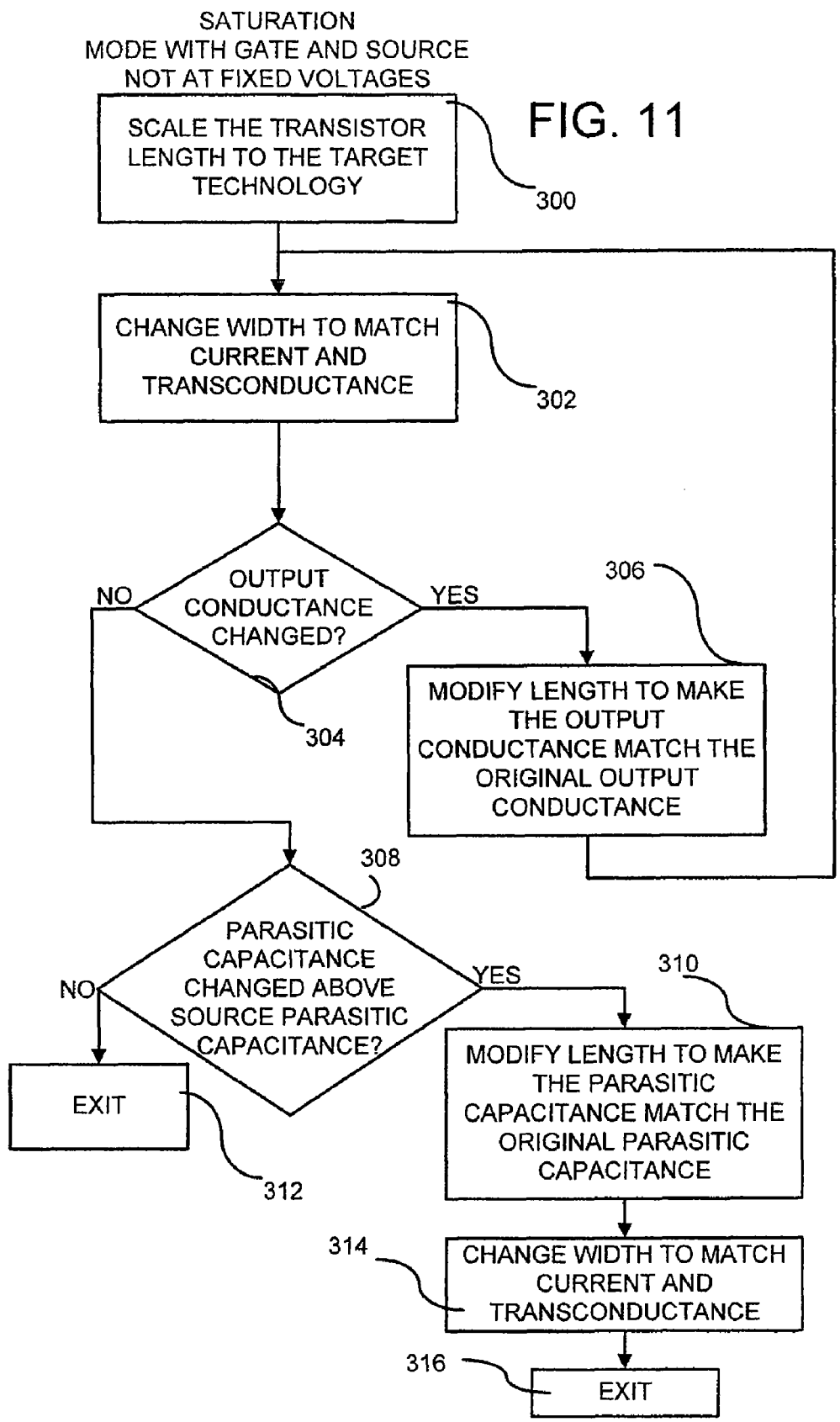

ANALOG DESIGN RETARGETING

CROSS REFERENCE TO RELATED APPLICATIONS

This is the U.S. National Stage of International Application No. PCT/EP2005/054928, filed Sep. 29, 2005.

TECHNICAL FIELD

The present invention generally relates to Integrated Circuit design retargeting and, more particularly, to automated conversion of analog integrated circuits from a source technology to a target technology.

BACKGROUND ART

The complexity of integrated circuits (ICs) being designed nowadays is continuously increasing and has resulted in complete system-on-chip (SoC) solutions. Even more, the complexity of such integrated systems is exploding thanks to advances in process fabrication. The limiting factor is now the ability to design, manage and verify such systems rather than the ability to fabricate them.

As SoC's are becoming larger, the only way to efficiently design such dense SoC's, both from the design complexity and time-to-market aspects, is by embedding Intellectual Property (IP) cores. Standards for such cores are currently evolving. Ideally, they should be reusable, pre-characterized and pre-verified. But as fabrication technology changes, it is desirable to convert or migrate the design to the new process parameters. For example, an IP core may be designed and tested for 90 nm technology, but it is desirable to convert the IP core to a new process of 60 nm technology.

IP reuse methodologies are readily available for digital blocks, thanks to the well-structured and cell-based design characteristics of the digital world. This is completely different on the analog side, where each circuit block (which may contain thousands of devices) is carefully redesigned from scratch each time. The main obstacle for analog IP migration is that analog design is highly sensitive to device physical parameters and parasitics and to global technology constraints. This makes the retargeting of an analog portion of any design a tough task and is still a manual process.

Several approaches for analog reuse has been implemented in previous work and most of them rely on optimization techniques. The optimization engine visits candidate circuit designs and adjusts their parameters in an attempt to satisfy their user's specified performance goals. A first group of optimization techniques use analytical models that describe the basic performance of the circuit using symbolic equations. A second group of optimization techniques uses the full spice accuracy. Using a full analog simulator capability has the advantage of accurate results but suffers from being very slow, since it has to perform lengthy transient simulation over and over to evaluate the performance of the circuit and make sure it satisfies the target goals. On the other hand, using analytical equations has the impact of less accurate designs with faster results. Nonetheless, neither of these techniques is ideal as there is a need for increased accuracy and speed.

Another problem with the prior-art techniques is that they are closer to a circuit re-design than design reuse. All design knowledge and tradeoffs, implicitly coded by the first designer in the initial design are completely lost. In addition, optimization-based techniques are only adapted to cell sizing due to extensive use of computer resources. Therefore, the prior-art techniques are less suitable for migrating a complete mixed-signal function (e.g., analog-to-digital converter, PLL, ...)

Thus, it is desirable to provide an analog design retargeting system that has the ability to take an already designed, sized and verified circuit in a source technology and map it to a different target technology while preserving the same general architecture and performance characteristics.

DISCLOSURE OF INVENTION

The present invention provides a retargeting system and method for converting a circuit from a source technology to a target technology, while maintaining substantially the same circuit specifications as the original design.

In one aspect, the analog circuit is converted from the source technology to the target technology by analyzing and resizing the circuit at the device level. For example, the analysis may include determining a mode of operation for a transistor and resizing based on the mode of operation. In another example, the analysis may include determining node voltages coupled to a device and resizing based on the determined node voltages.

In another aspect, the retargeting system and method relies on mapping of each transistor design parameters, without evaluating the circuit performance. It is therefore independent of the circuit under consideration and does not resort to time-consuming circuit simulation and/or circuit optimization techniques. The system and method may also be hierarchical which allows handling of macro-functions.

In another aspect, the invention uses a complete spice simulator to preserve the accuracy of the migrated design, but in the meantime it doesn't rely on executing any performance evaluation with a transient analysis. Rather, it is based on performing a DC analysis to extract some parameters from the original design and then resizing the circuit by preserving these parameters between source and target technologies.

These features and others of the described embodiments will be more readily apparent from the following detailed description, which proceeds with reference to the accompanying drawings.

BRIEF DESCRIPTION OF THE DRAWINGS

FIGS. 10A-C are flowcharts showing further details for converting a transistor with fixed gate and source voltages to a target technology, based on the mode of the transistor.

FIG. 11 is a detailed flowchart for converting a transistor that does not have fixed gate and source voltages to a target technology with the transistor in the saturation mode.

DETAILED DESCRIPTION

Figure 1:
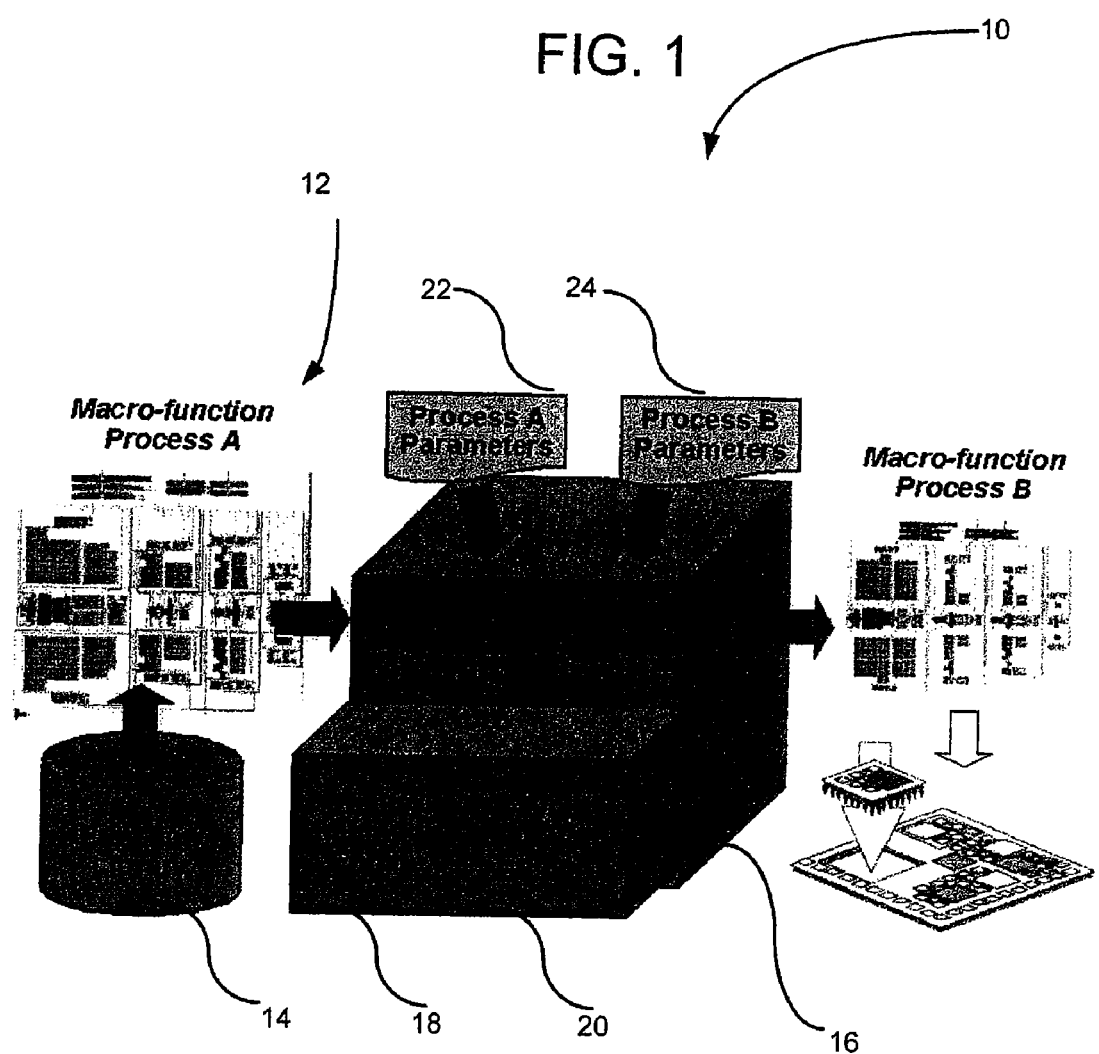
FIG. 1 shows an overall system diagram for converting an analog circuit design from a source technology to a target technology according to the invention.

FIG. 1 shows a system 10 used to retarget an analog design 12 representing a certain functionality found in function library 14. The design 12 is made according to a source technology shown simply as "Process A" and is converted to a target technology shown simply as "Process B" by a migration engine 16. Such a migration is generally called "retargeting". The analog design 12 may contain traditional analog devices, RF devices, and mixed-signal devices. Migration engine 16 includes a netlist migration engine 18 and a layout migration engine 20. The netlist migration engine 18 is used to convert a netlist in the source technology to the target technology. To perform such a conversion, as described further below, the netlist migration engine extracts design information to obtain operational parameters and the design expertise embedded in the source design. Additionally, the netlist migration engine 18 uses the fabrication process data of both the source and target technologies (shown at 22, 24, respectively) to map the analog circuit to the target technology. A final verification step is usually desirable. This is achieved by simulating the obtained netlist and comparing the results with the source design.

The retargeting method maps each transistor's design parameters, without evaluating the circuit performance. It is therefore generally independent of the circuit under consideration and does not resort to time-consuming circuit simulation and/or circuit optimization techniques. The method is also hierarchical allowing handling of macro-functions. The methodology is a one-way approach with no time-consuming optimization loops.

The layout migration engine 20 focuses on converting the physical layout of the circuit 12 in the source technology to the target technology. Any desired layout migration engine 20 may be used, or the layout procedure may be accomplished manually as this aspect is not of importance to the invention. In any event, the layout migration engine 20 uses information about the source and target processes 22, 24 to translate the source layout into an equivalent layout in the target process. The new layout is fully verified based on the rules for the target process and any other constraints provided by the user.

Figure 2:
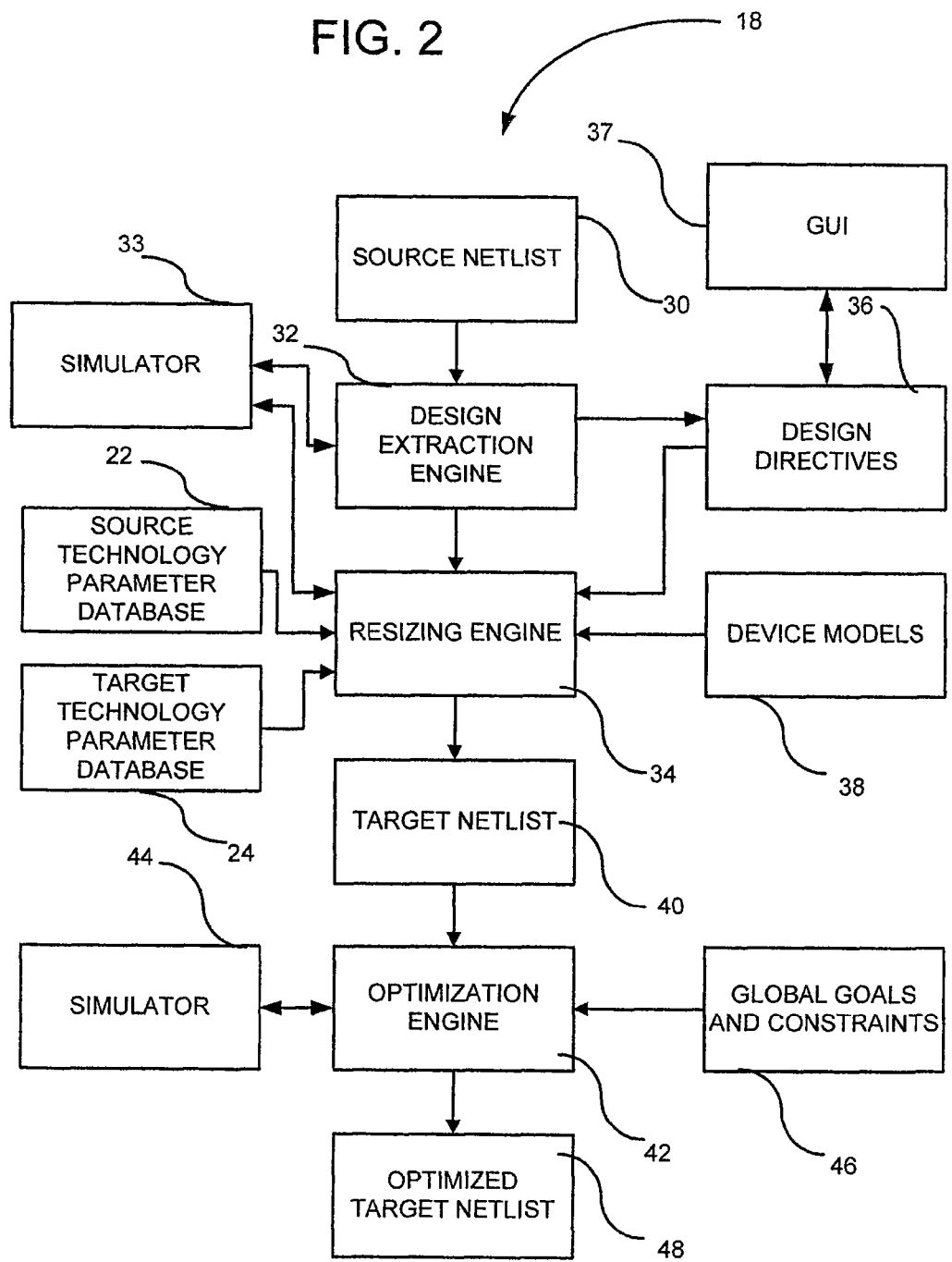
FIG. 2 is a detailed system diagram of a netlist migration engine shown in FIG. 1.

FIG. 2 shows further details of the netlist migration engine 18. A netlist 30 includes at least a list of electrical devices (e.g., transistors, resistors, capacitors, etc.) in the circuit and the interconnections between the devices. The desired result is to convert this netlist 30 into the target technology. The netlist migration engine 18 includes two sub-engines: a design extraction engine 32 and a resizing engine 34. As described more fully below, the design extraction engine 32 may perform many tasks such as partitioning the design, extracting the design hierarchy, overseeing that the design is simulated, extracting the electrical properties, determining symmetrical devices and performing circuit-type (also called block) recognition. The resizing engine 34 resizes the circuit at the device level, meaning that the resizing engine resizes substantially each transistor, resistor, and capacitor individually. Such device-level resizing is different than prior-art techniques that treat a block as one entity and modify device sizes of many transistors within the block at one time.

Design directives block 36 is coupled to the design extraction engine 32 and receives from the engine 32 circuit information, such as the circuit hierarchy and node voltages. This information is displayed on a user interface 37 to display to the user the circuit hierarchy, the physical devices with names, and the node voltages. The user then can modify certain features, such as marking transistors as symmetrical, placing constraints on nodes, scaling, and marking certain nodes as master or slave. A scaling factor of 1 means that the current level between the source and target technology is the same. Other scaling factors may be used. For example, a scaling factor of 0.5 means that the current level of the target is half those of the source. This information is then fed back to the resizing engine 34. Thus, the designer can control and fine-tune the retargeting process. The design directives are composed of two main categories:

1. Information concerning interface nodes of each sub-circuit:

The type of each of these nodes.

An absolute voltage value is desired for those nodes of type F. The default value is the old node voltage multiplied by $X_{DD}$.

The signal input and output node names of each block.

2. The load capacitance of each block. The default value of the any capacitor is calculated according to equation (15) (described below) for dynamic range considerations.

The device models 38 include information regarding the physical aspects of the devices. A device model contains several process related parameters such as substrate doping, oxide thickness, drift velocity, junction depth, charge storage, mobility, temperature coefficients, zero-bias threshold voltage and others. All these parameters are used to model the physical behavior of the device during simulation. Some of the effects that are modeled using these parameters can be channel length modulation, carrier velocity saturation, non-uniform channel doping, sub-threshold conduction, drain-induced barrier lowering, source/drain charge sharing and others. Modeling more effects requires more complexity in the model but in the meantime gives more accuracy. A DC simulation is performed by simulator 33 coupled to both the design extraction engine 32 and the resizing engine 34. The DC simulation is very fast because voltage levels are fixed in order to solve for the currents. The resizing engine 34 then uses the design directives 36, the source and target parameter databases 22, 24 and device models 38 to perform the resizing at the device level. The resizing engine 34 then outputs the target netlist 40 with the electrical devices resized in the target technology. This target netlist may be used to perform the layout. Or instead, a further optimization may be performed by passing the target netlist 40 through an optimizing engine 42 that interacts with simulator 44 and a constraints file 46 to produce the final output 48. The constraints file 44 includes global goals and constraints. The global goals may include timing issues, such as rise time, fall time, delay, gain, phase, etc. obtained from a previously performed simulation or from data sheet information. The constraints are additional features that the user can dictate, such as a required voltage on a given node, a certain transistor must remain in a certain operational mode, device dimensions, etc.

Figure 3:
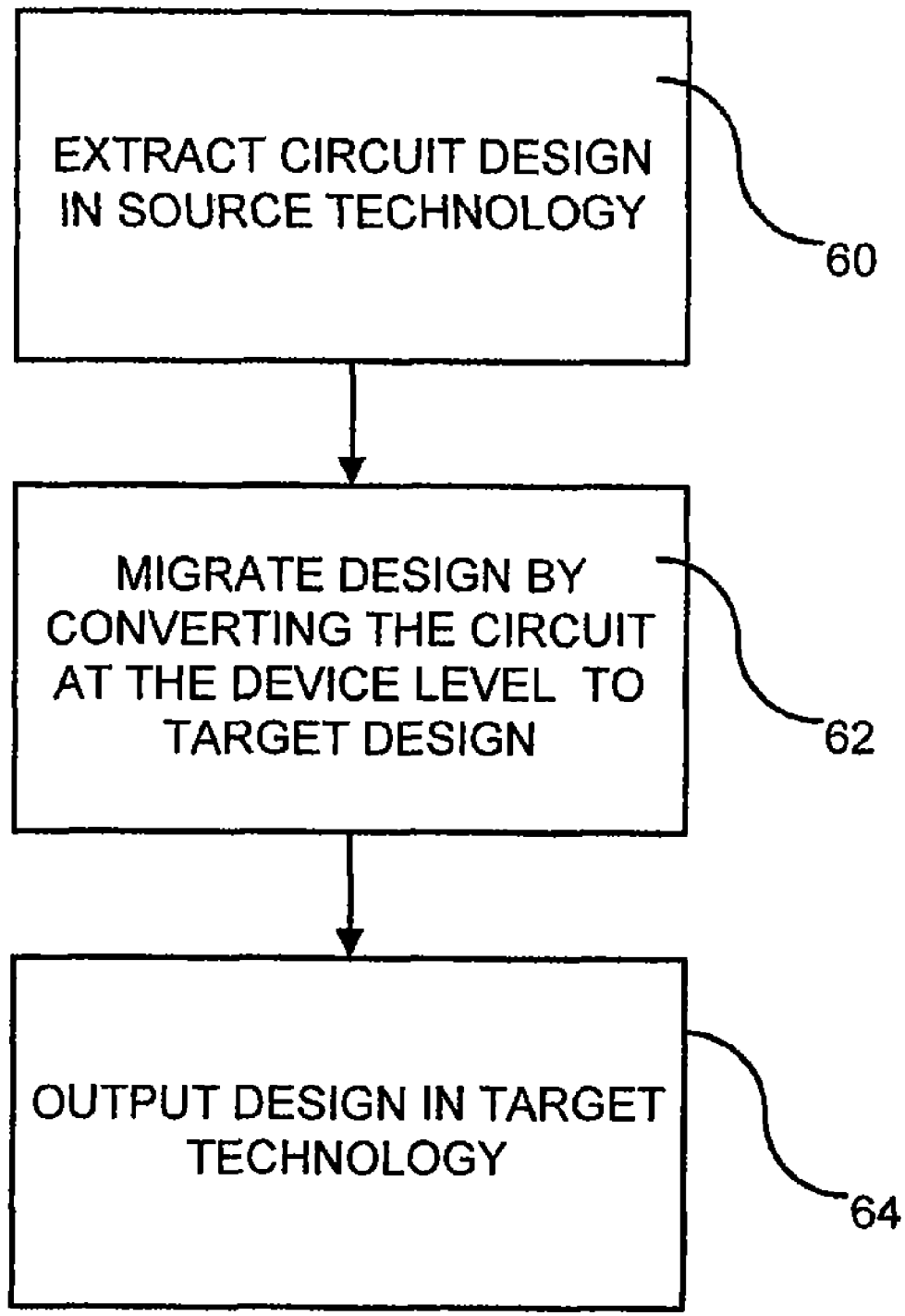
FIG. 3 is a flowchart of a method for converting a circuit to a target technology.

FIG. 3 shows a high-level flow chart of a method for migrating the analog circuit to a target technology. In process block 60, the analog circuit is extracted in the source technology. Details of the extraction process are described further below in relation to FIG. 4, but basically the extraction process obtains the electrical parameters (e.g., node voltages) of the circuit. In process block 62, the design is migrated by converting the analog circuit on the device level. Thus, individual transistors, resistors, and capacitors are analyzed and resized. By performing the conversion at the device level and ensuring the functionality of each device is the same, the overall design performance is maintained. In process block 64, the design is output in the target technology.

Figure 4:
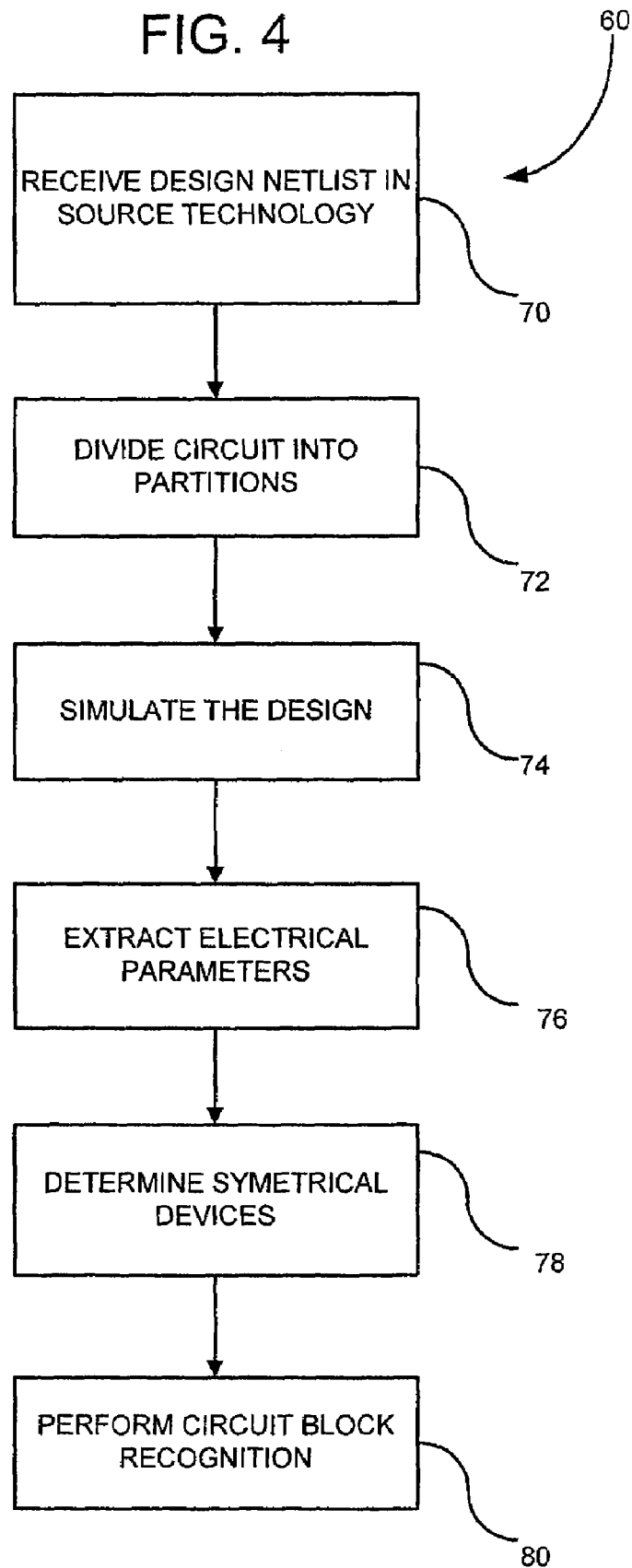
FIG. 4 is a detailed flowchart of a method for extracting a design.
Figure 5:
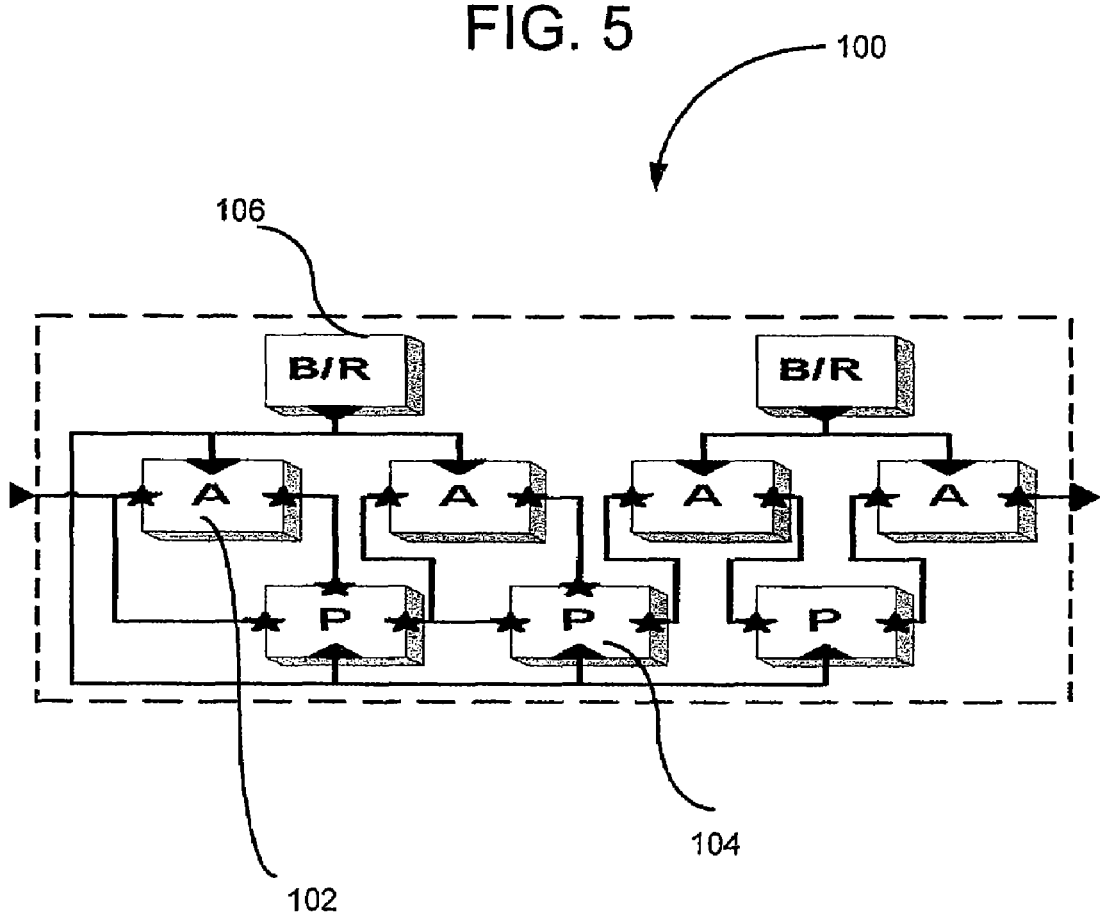
FIG. 5 shows an example partitioned circuit.

FIG. 4 shows a more detailed flowchart of the extraction 60 of FIG. 3. In process block 70, a netlist containing the analog design in the source technology is received. In process block 72, the circuit is partitioned into blocks. FIG. 5 shows an example of such a partitioning. The partitioning depends on the logical hierarchy of the circuit as identified in the netlist and may be modified depending on the particular application. There are numerous well-known techniques for partitioning a circuit from a netlist, any of which may be used. In process block 74, the analog design is simulated. Generally, this is a DC simulation, which is very fast because voltage levels are fixed in order to solve the circuit. In order to perform the simulation, a file (not shown) containing predetermined input voltages based on the circuit description is used to stimulate the circuit. In process block 76, the electrical parameters are extracted from the simulation. For example, the node voltages, currents, noise information, transistor modes (e.g., sub-threshold, saturation, and linear), etc. are obtained. The retrieved design information is divided to two categories: Electrical parameters and topological parameters. For electrical parameters the extraction includes electrical device parameters and element values. For example, for each MOS transistor, the following is extracted:

Transistor dimensions (W and L),

Characteristic voltages (threshold and saturation voltages),

The relative bias point,

Small-signal conductances and capacitances,

The corresponding noise contribution.

Physical implementation information such as the number of folds is also extracted.

This is usually done through a simple dc operating-point simulation followed by a noise analysis.

For topological parameters, the following may be extracted:

Hierarchical connectivity information embedded in the source netlist. All instances are identified and linked to their sub-circuit, as well as all nodes of each sub-circuit.

Basic block recognition: Since retargeting is carried out on the device level, different requirements and optimization constraints are desired for different devices. The hierarchical building block library may be used, such as disclosed in H. Graeb, S. Zizala, J. Eckmueller, K. Antreich, "The Sizing Rules Method for Analog Integrated Circuit Design", *Proc. ICCAD*, 2001.

In process block 78, an analysis of circuit is undertaken to detect symmetrical devices. Defining two devices as symmetrical depends on the application. However, devices are generally checked to see if two transistors are in some way connected and have the same dimensions. For example, if two transistors have their gates connected together and the transistors have the same dimensions, then they are defined as symmetrical. As described further below, when one device is migrated to the new technology, such migration is automatically propagated to the other associated symmetrical devices. Symmetrical transistors are defined as follows:

Transistors with their gates connected to each other and having the same dimensions.

Transistors with their sources connected to each other but not connected to either the supply voltage or to ground and having same dimensions Transistors having the same dimensions and with their sources connected to each other and with their drain voltage equal to each other In process block 80, circuit block recognition is performed. Thus, an analysis is carried out to check if a transistor is part of a predetermined circuit type and, if so, it is flagged for future use, as described further below. Examples of circuit blocks include differential pairs, current mirrors, level shifters, flip flops, and current sources. This information is placed in a constraint file that the user can modify.

FIG. 5 is a simple example of a circuit 100 partitioned into design blocks. In this example, the circuit is partitioned into active blocks 102, passive blocks 104, and bias and reference blocks 106. Active blocks 102 are the main signal processing blocks in the system. For example, operational amplifiers, comparators, etc. Passive blocks 104 contain passive components, such as capacitors, resistors, and switches. The bias and reference blocks 106 contain the DC bias and reference generators for different blocks in the circuit. For active and passive blocks, the absolute bias/reference voltage of the input and output nodes, marked by stars, are usually set by the system requirements in order to fit in the surrounding environment of other blocks and facilitate block interconnection. In general, this voltage is set as a ratio of the supply voltage (x.VDD) and in most cases it is set to the middle of the supply voltage to maximize signal swing (x=0.5). During design retargeting, this ratio (x) should generally be respected. For bias and reference blocks, the voltage of output nodes is dictated by the needs of the other blocks.

Figure 6:
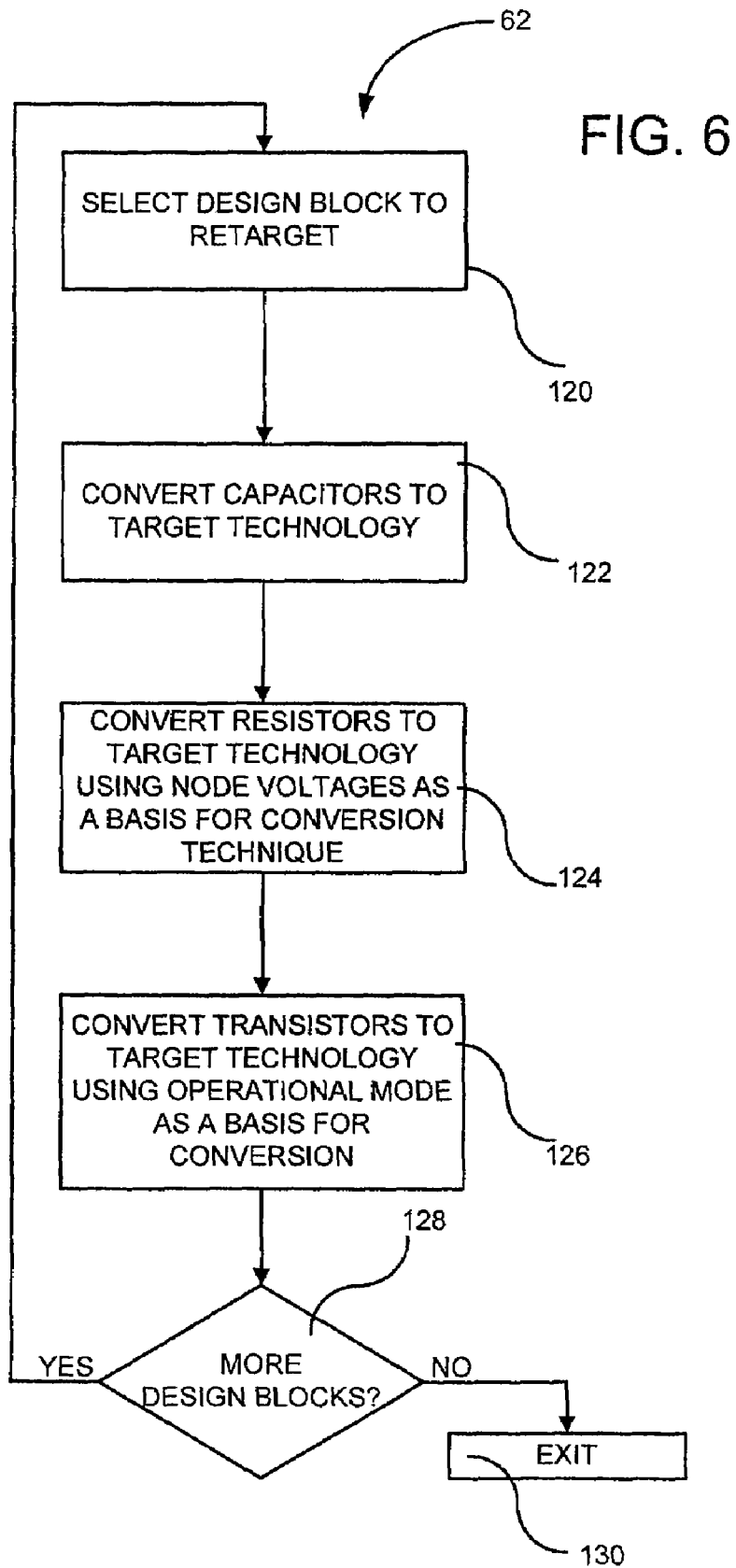
FIG. 6 provides a top-level flowchart to convert the design to the target technology.

FIG. 6 is a flowchart showing further details of process block 62 of FIG. 3. In process block 120, a design block is selected. Block selection is based on predetermined criteria depending on the particular application. For example, active and passive blocks are generally chosen before bias and reference blocks. Resizing proceeds one (block) sub-circuit at a time. The order depends on the sub-circuit interface nodes. If one of these nodes is designated as a slave node, that block is analyzed later, while blocks with master nodes are given priority. Nodes are classified to the following types:

Fixed voltage (F) nodes, whose default value is $V_{DD\_source} \times X_{DD}$, but can be modified by the user.

Variable voltage (V) nodes, which should be determined during resizing. However, since these nodes are shared between multiple sub-circuits, there should be a master sub-circuit for each of these nodes that determines its value, afterwards, these nodes become fixed for other slave sub-circuits. Therefore this node type is further divided to variable master (VM) and variable slave (VS) types. For example, the bias node of an opamp is of a VM, while the same node for the bias circuit that produces the needed voltage value has a VS type.

Figure 7:
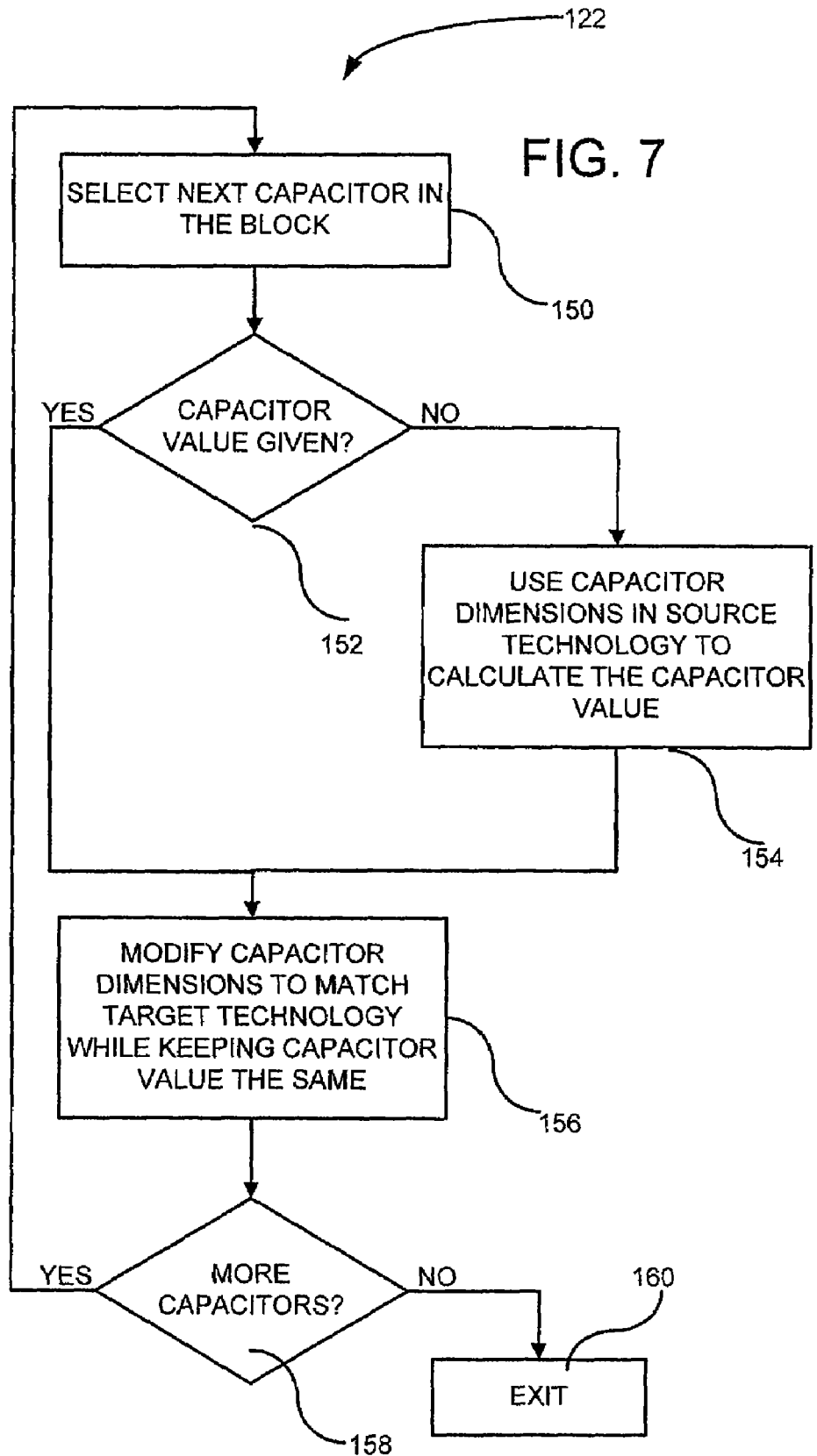
FIG. 7 provides a detailed flowchart for converting a capacitor to the target technology.
Figure 8:
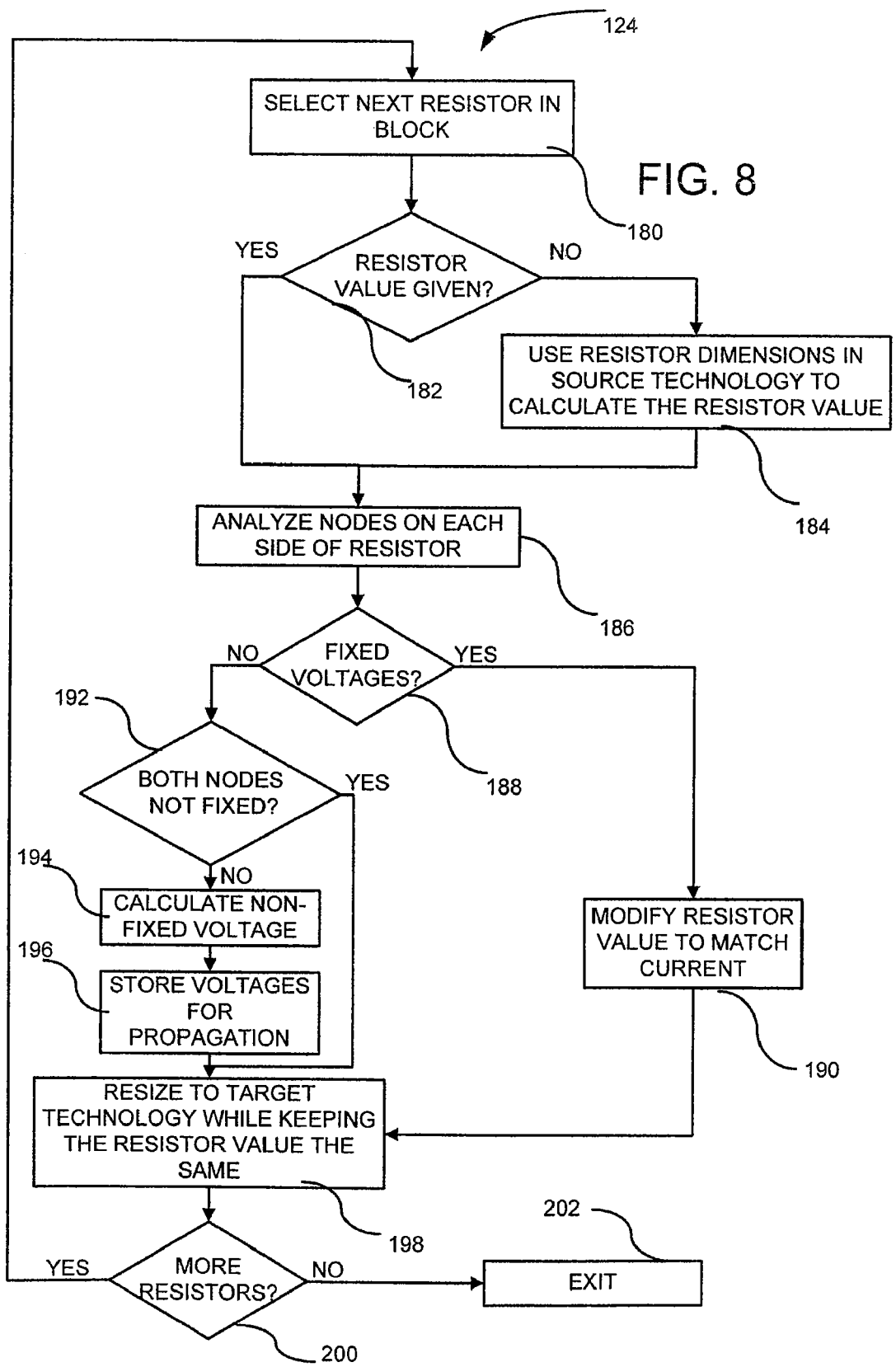
FIG. 8 provides a detailed flowchart for converting a resistor to the target technology.
Figure 9:
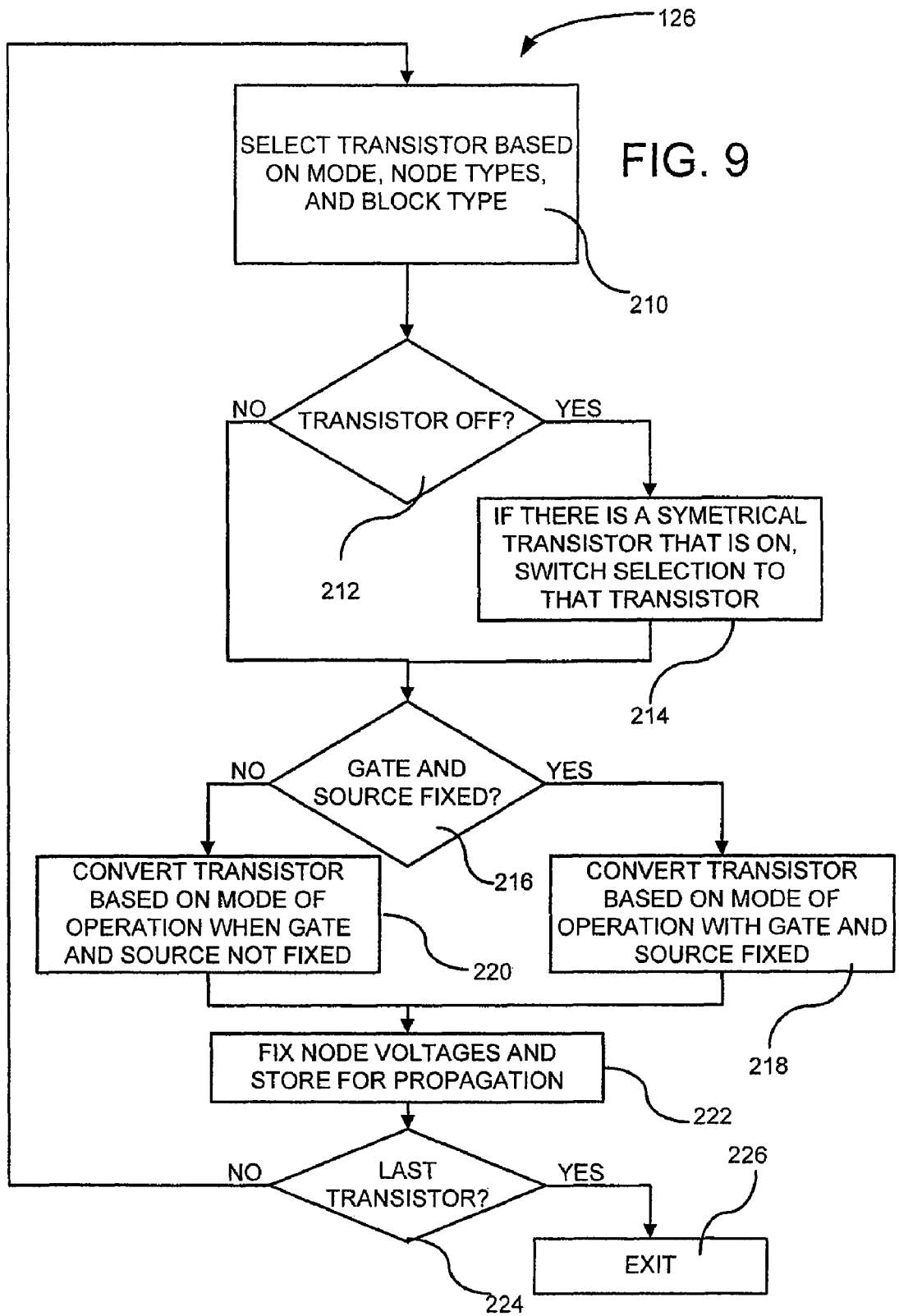
FIG. 9 shows a detailed flowchart for converting a transistor to a target technology.

Using the connectivity information, voltage levels at the interface nodes are updated after the resizing of each block. In process block 122, the capacitors within the selected block are converted to the target technology. FIG. 7 provides further details of converting capacitors. In process block 124, resistors in the selected block are converted to the target technology. In so doing, the node voltages associated with the resistors are taken into consideration. FIG. 8 provides further details of converting resistors. In process block 126, the transistors in the selected block are converted to the target technology. Such conversion takes into consideration the operational mode (e.g., sub-threshold, saturation, linear) of the transistor. FIGS. 9-11 provide further details on converting transistors. In decision block 128, a determination is made whether there are more blocks in the design to migrate. If yes, the loop continues at 120. If no, the loop is exited at process block 130. Thus, one aspect indicated in FIG. 6 is that the analog circuit is converted at the device level by resizing the individual transistors, resistors, capacitors, etc.

FIG. 7 is a flowchart showing further details of process block 122 for converting a capacitor. In process block 150, a next capacitor in the block is selected. In decision block 152, a determination is made whether the capacitor value is provided in the netlist. If not, the capacitor value is computed (process block 154) using the capacitor dimensions in the source technology. In process block 156, the capacitor dimensions are modified to match the target technology, while keeping the capacitor value the same or applying any desired scaling factor. In decision block 158, a check is made whether more capacitors are present in the current block being analyzed. If yes, the loop continues at process block 150. If no, the flow is exited (process block 160). Although not shown, it will be recognized that the capacitor values may be scaled according to a scaling factor.

FIG. 8 is a flowchart showing further details of process block 124 for converting a resistor. In process block 180, a next resistor in the block is selected. In decision block 182, a check is made whether the resistor value was provided in the netlist. If not, then the resistor dimensions in the source technology are used to calculate the resistor value (process block 184). The process then continues at process block 186 where the resistor node voltages obtained during the simulation are analyzed. In decision block 188, a determination is made whether the node voltages are fixed. If yes, the resister value is modified to match the current obtained during simulation (process block 190). If no, then in decision block 192 a determination is made whether the node voltages are both not fixed. If one is fixed, then in process block 194, the other node voltage is calculated using the known current, resistor, and voltage values. The calculated voltage values are then stored so that they can be propagated to future determinations (process block 196). In process block 198, the resistor is resized to the target technology while maintaining the resistor value (or taking into account a scaling factor). In decision block 200, a check is made whether there are more resistors in the current circuit block being analyzed. If yes, the loop continues at process block 180. If no, the flow exits at process block 202. Although not shown, the resistor values can be scaled based on a scaling factor.

FIG. 9 shows further details of process block 126 of FIG. 6. In process block 210, the next transistor to resize in the current circuit block being analyzed is selected. This transistor selection is based on a weighting factor taking into consideration the mode of the transistor (sub-threshold, saturation, linear), the nodes associated with the transistor (fixed or not fixed), the block type (differential pair, current mirror, level shifter, etc.). The weighting system is chosen by the user based on the particular application. In decision block 212, a determination is made whether the transistor is off. If yes, then in process block 214, a check is made whether there is a symmetrical transistor that is on. If so, the analysis is passed to the symmetrical transistor, as the results are more accurate with a transistor turned on. The flow continues with decision block 216 that determines if the gate and source are fixed. If yes, process block 218 performs the migration as further described in FIGS. 10A-C. If no, then process block 220 performs the migration as further described in FIG. 11. After the migration, any node voltages that have been determined are stored for propagation to other devices to be migrated (process block 222). In decision block 224, a determination is made whether this is last transistor in the current circuit block being analyzed. If yes, the flow is exited (process block 226). If no, then the loop continues by selecting the next transistor to migrate at process block 210.

FIG. 10A is a flowchart showing further detail of process block 218 with a transistor in the saturation mode. In process block 230, the length of the transistor is changed from the length in the source technology to the length in the target technology. In process block 232, the width of the transistor is modified until the current matches that determined during simulation. Thus, the goal is to modify the size, while maintaining the current the same. In decision block 234, a check is made whether the output conductance determined during simulation changed outside a certain accuracy limit (e.g., 3% of the source value for a scaling factor of 1). If the scaling factor is changed then this should be taken into account in this determination. For example, if the scaling factor is 0.5, the source transistor is multiplied by the scaling factor to determine the desired target transistor and this target transistor is used in association with the accuracy limit. If yes, the length is modified again until the output conductance is within acceptable limits (process block 236) and the flow loops back to process block 232. If the output conductance has not changed (in decision block 234), the parasitic capacitance is checked to see whether it has changed above a source parasitic capacitance (decision block 238). If yes, then the length is modified in process block 242 until the parasitic capacitance is within a desired limit. In process block 244, the transistor width is changed to match the desired current and then the routine is exited (process block 246). If decision block 238 is answered in the negative, the routine exits at 240.

Figure 10B:
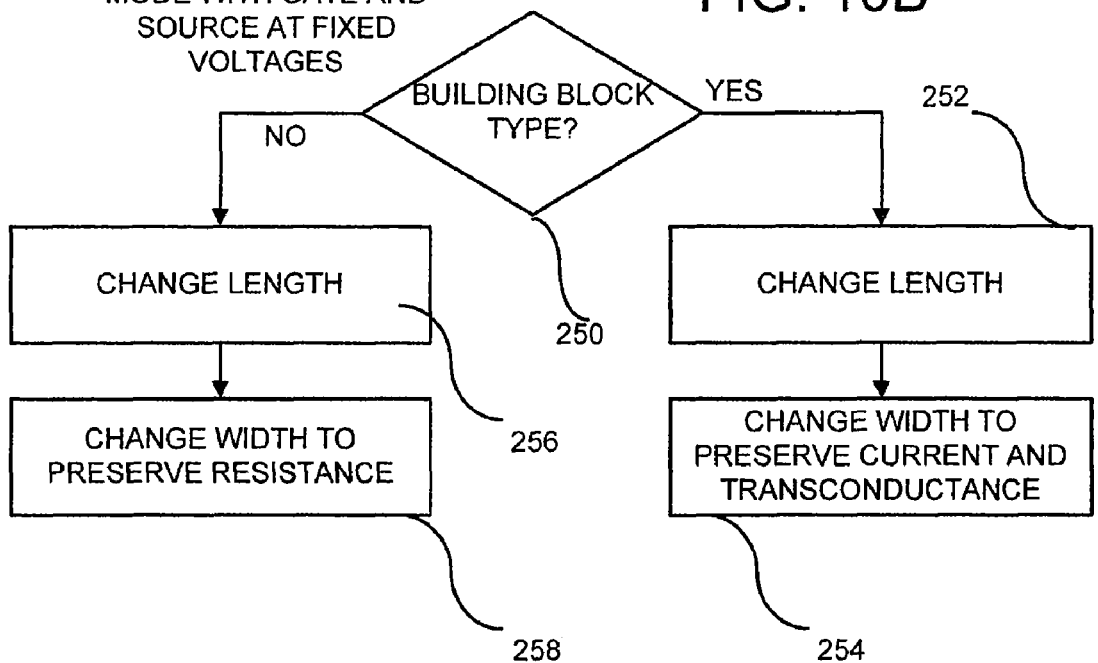

FIG. 10B shows a flowchart of further details of process block 218 with a transistor in sub-threshold mode. In decision block 250, a determination is made about whether the transistor is included in one of a predetermined list of circuit blocks (differential pair, current mirror, etc.). If so, in process block 252, the length is changed to match the target technology. In process block 254, the width is changed until the current and transconductance match those simulated in the source technology. If in decision block 250, the transistor is not of a predetermined circuit block, then in process block 256 the length is changed to match the target technology. In process block 258 the width is changed until the resistance matches that in the source technology.

Figure 10C:
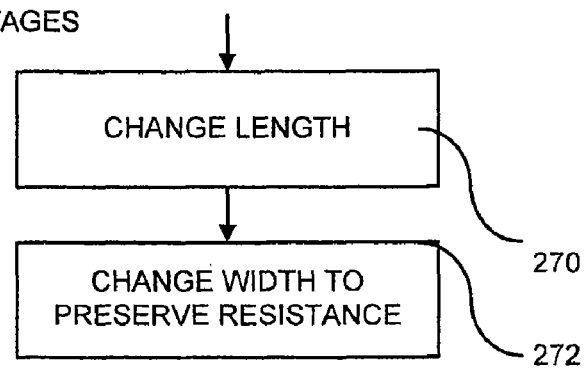

FIG. 10C shows a flowchart of further details of process block 218 with a transistor in linear mode. In process block 270, the length is changed to match the target technology. In process block 272, the width is changed until the resistance matches that in the source technology.

FIG. 11 is a flowchart showing further detail of process block 220 with a transistor in the saturation mode. In process block 300, the length of the transistor is changed from the length in the source technology to the length in the target technology. In process block 302, the width of the transistor is modified until the current and transconductance match those determined during simulation. In decision block 304, a check is made whether the output conductance determined during simulation changed outside a certain accuracy limit. If yes, the length is modified again until the output conductance is within acceptable accuracy limits (process block 306) and the flow loops back to process block 302. If the output conductance has not changed (in decision block 304), the parasitic capacitance is checked to see whether it has changed above the source parasitic capacitance (decision block 308). If yes, then the length is modified in process block 310 until the parasitic capacitance is within a desired limit. In process block 314, the width is changed to match the current and transconductance and the flow exits at 316. If decision block 308 is answered in the negative, the routine exits at 312.

For subthreshold mode and linear mode and the gate and source not fixed, the flow is the same as already described in FIGS. 10A-C.

Figure 12:
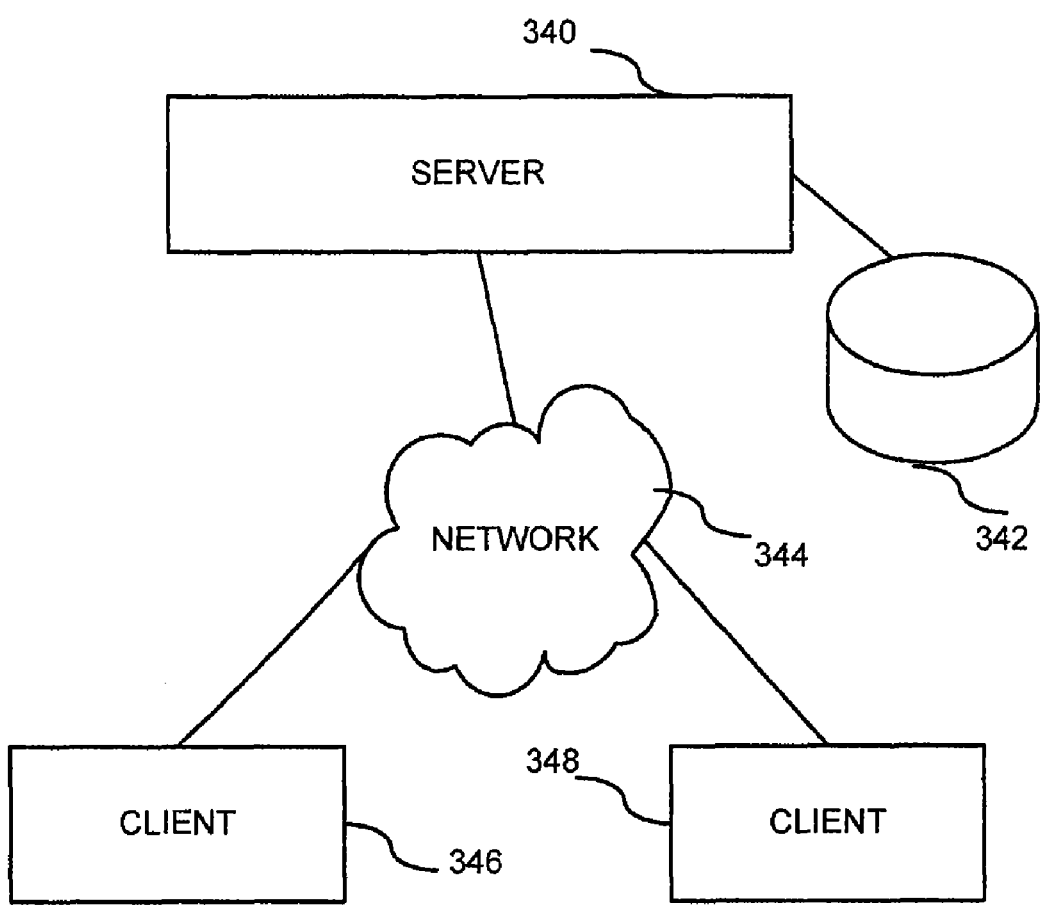
FIG. 12 shows a network environment in which the system may be used.

FIG. 12 shows that portions of the system 10 may be applied to a distributed network, such as the Internet. For example, a server computer 340 may have an associated database 342 (internal or external to the server computer). The server computer is coupled to a network shown generally at 344. One or more client computers, such as those shown at 346 and 348, are coupled to the network to interface with the server computer using a network protocol.

Figure 13:
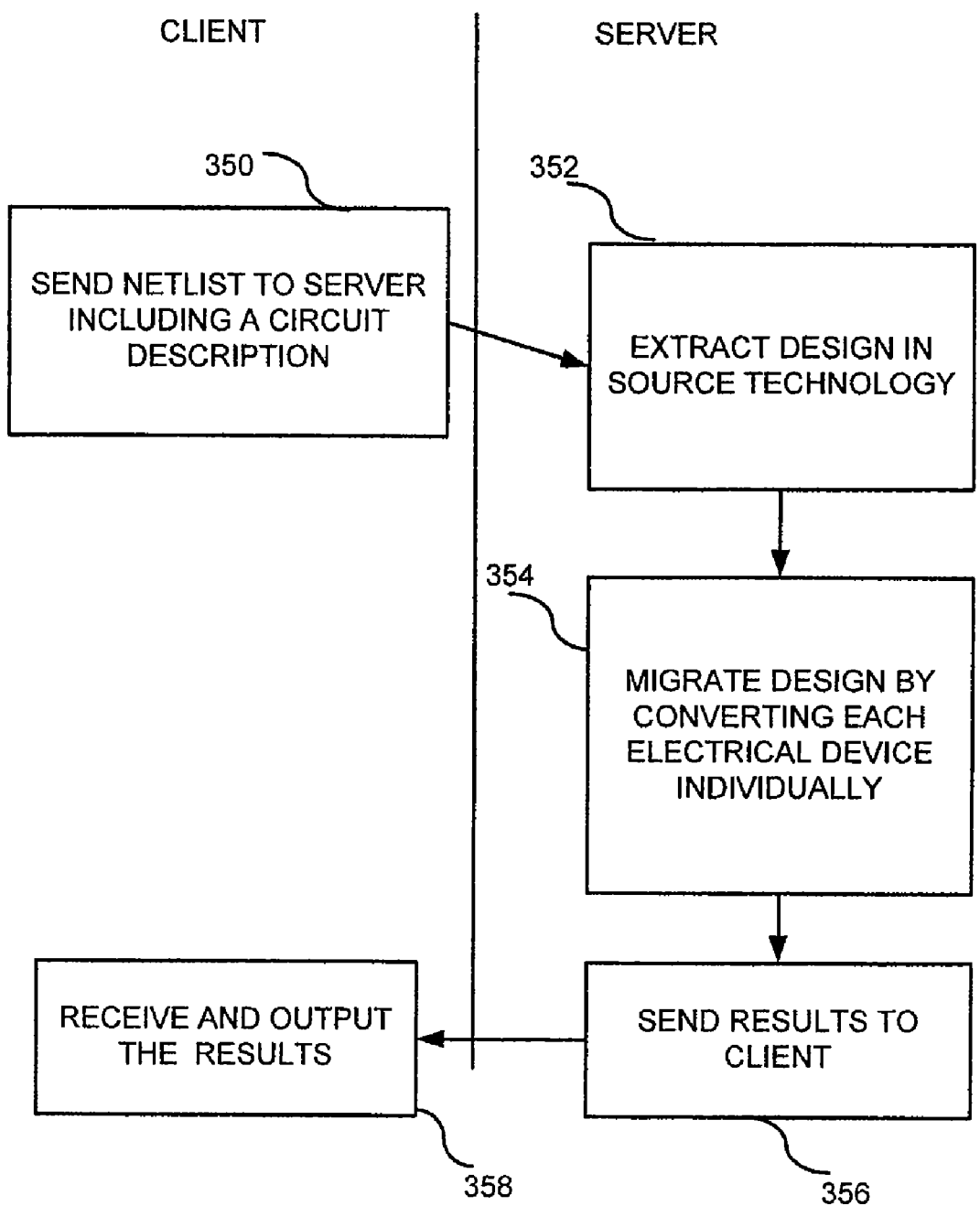
FIG. 13 shows a flowchart of a method for retargeting over the network of FIG. 12.

FIG. 13 shows a flow diagram using the method on the network of FIG. 12. In process block 350, the netlist is sent from a client computer, such as 348, to the server computer 340. In process block 352, the circuit described in the netlist is extracted. In process block 354, the design is migrated to the target technology by converting individual devices. In process block 356, the results are returned to the client computer via the network 344. In process block 358, the client computer displays or otherwise provides the results to the user.

Figure 14:
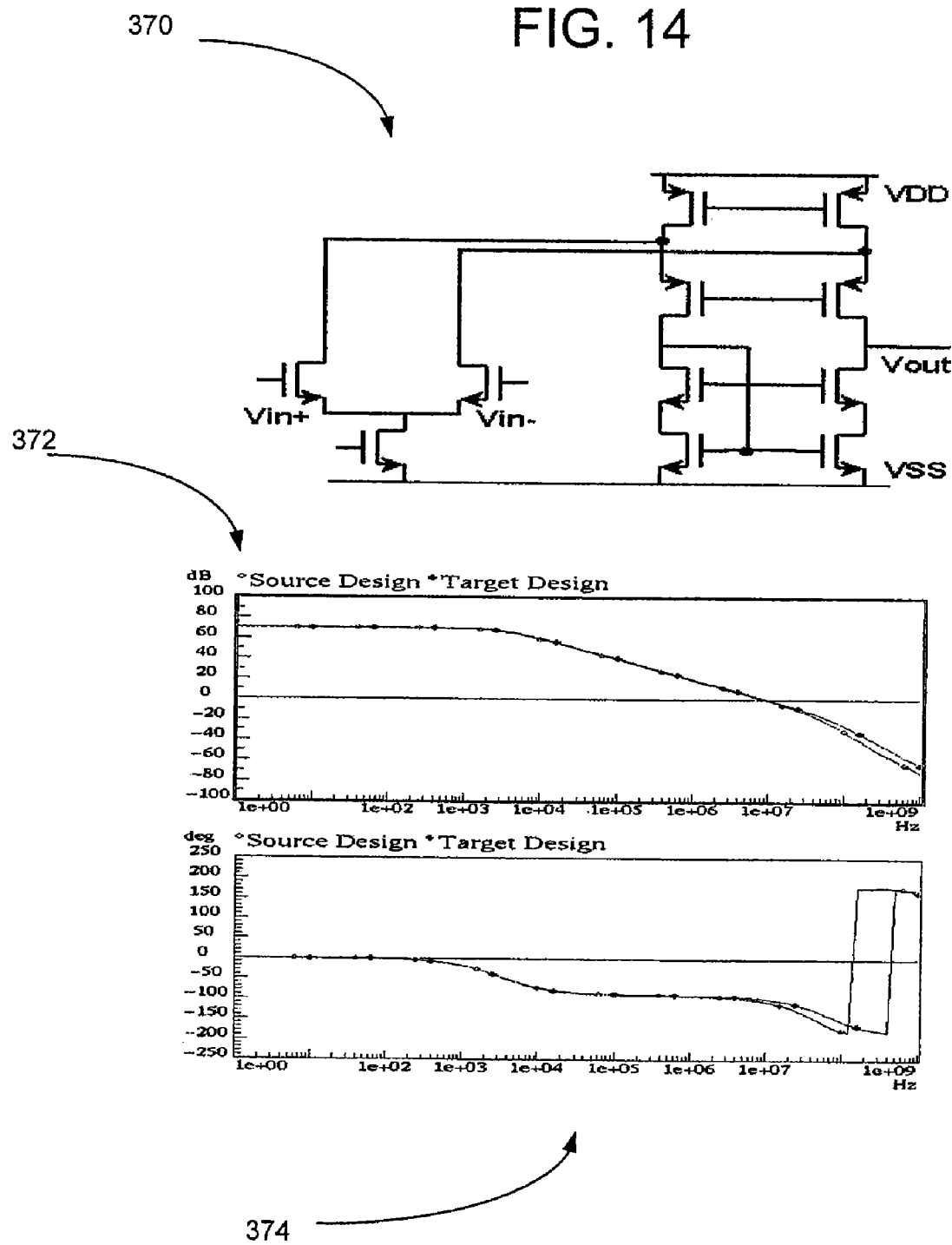
FIG. 14 shows a sample converted circuit with charts showing overlapping gain and phase.

FIG. 14 is an example of successfully migrated circuit 370. The source technology was a 0.6μ process with a supply voltage of 3.5V, while the target technology was a 0.25μ process with a supply voltage of 2.5V from a different foundry. The results of simulations for the gain including magnitude 372 and phase 374 are shown for the source circuit as well as the target. Results show the same circuit performance up to beyond the gain-bandwidth frequency at around 10 MHz.

The following observations may be used in the system and method:

The performance characteristics of analog circuits can be divided to small-signal (linear) characteristics such as the small-signal gain and gain-bandwidth product (calculated after circuit linearization in the frequency-domain), and large-signal (non-linear) ones such as the slew rate and the settling time (calculated in the time-domain).

Small-signal or linear characteristics are characterized by a transfer-function in the complex s-domain, completely defined by a dc gain (A), and poles and zeros which define the variation of the transfer function with frequency, where:

The gain of the transfer function is proportional to $$A \propto \frac{g_m}{g_{ds}} \quad (1)$$

The dominant pole is proportional to $$\omega_{pd} \propto \frac{g_{ds}}{C_L} \quad (2)$$

where $C_L$ is either the load or compensation capacitance. Non-dominant poles and zeros are proportional to $$\omega_{pnd}, \omega_z \propto \frac{g_m}{C_p}, \frac{g_{ds}}{C_p} \quad (3)$$

where $C_p$ is usually due to parasitic capacitances.

In the above equations, $g_m$ and $g_{ds}$ are transistor transconductance and output conductance respectively (not necessarily for the same transistor in the circuit under consideration). Both $g_m$ and $g_{ds}$ are directly proportional to the bias current for a constant $V_{GS}-V_{th}$. A first-order calculation gives $$g_m = \frac{2I_D}{(V_{GS}-V_{th})} \quad (4)$$

$$g_{ds} = \lambda I_D \propto \frac{I_D}{L} \quad (5)$$

Large-signal or non-linear characteristics are related in part to the small-signal ones, in addition to the ratio between the bias current and load capacitance. For example the slew rate is proportional to $$SR \propto \frac{I_{bias}}{C_L} \quad (6)$$

The same device can be used for different functions. For example, a simple transistor can be used as a switch, as a gain stage, or in a current mirror. In each case the importance of transistor parameters varies according to the context: While for a switch the most important transistor parameter is the on-conductance or $g_{ds}$, for a gain transistor the most important parameter is its transconductance or $g_m$.

The bias current in any active block: may be used to determine speed and noise performance; may be used to control both small and large-signal performance characteristics; for a given load capacitance, the ratio between the driving current and the load capacitance may be fixed for the same non-linear settling performance. Series transistors in the same circuit branch share the same current.

Bias voltages: We consider relative transistor bias voltages as follows $$V_{GST}=V_{GS}-V_{th}:$$

Determines the degree of inversion and the transconductance-to-current ratio and controls the transconductance $g_m$ $$V_{DST}=V_{DS}-V_{DSsat}:$$

Not as important as $V_{GST}$ since in saturation the current is to a first-order independent of $V_{DS}$. Only a factor of safety after $V_{DSsat}$ to ensure operation in saturation. Since series transistors should respect $\Sigma V_{DS}=V_{DD}$, and since $V_{DSsat}$ does not necessarily scale with the supply voltage, $V_{DST}$ should be adjusted with $V_{DD}$.

Noise: Sets a minimum limit on device sizes (transistors and capacitors). Determines the dynamic range (DR) defined by the ratio between the maximum input signal power and noise power. As the supply voltage decreases, the signal excursion decreases and so is the signal power. This puts new constraints on noise performance to keep the same dynamic range. The dominant sources of noise in the MOS transistor are flicker and thermal noise. Flicker noise is modeled as a voltage source in series with the gate with a value of $$V_{gf}^2(f) = \frac{K_f}{WLC_{ox}} \frac{1}{f} \quad (7)$$

$K_f$ is a process dependent constant. In saturation, thermal noise is modeled as an equivalent input noise voltage source given by $$V_{gt}^2(f) = \frac{8kT}{3 g_m} \tag{8}$$

Transistor W and L: The ratio W/L determines the transistor current and main performance characteristics. L sets the transistor area for a given W/L and consequently has a direct impact on the noise performance, refer to equation (7). L controls the output conductance $g_{ds}$, refer to equation (5). W controls parasitic capacitances and consequently has a direct impact on the frequency performance.

It can be shown that most of the transistor performance parameters, such as the transconductance, noise, and parasitic capacitance depend on the relative bias-point rather than the absolute value of terminal voltages.

The proposed retargeting methodology is based upon the following fact: If the relative operating point of each transistor in the target design is kept the same as that of the source design, the resulting performance specifications should match the initial specifications.

We define the following scaling factors, the suffix 2 refers to the target technology while the suffix 1 refers to the source technology:

Power supply scaling factor $$X_{DD} = \frac{V_{DD2}}{V_{DD1}} \tag{9}$$

Size scaling factor $$X_L = \frac{L_{min2}}{L_{min1}} \tag{10}$$

Current scaling factor:

$$X_I = \frac{I_{bias2}}{I_{bias1}} \tag{11}$$

To keep the same non-linear settling performance, refer to equation (6)

$$X_I = \frac{I_{bias2}}{I_{bias1}} = \frac{C_{L2}}{C_{L1}} \tag{12}$$

Switched-capacitors (SC) scaling factor:
Since SC noise power is given by $$N_{SC} = \frac{kT}{C} \tag{13}$$

while the signal power is proportional to the square of the supply voltage.

Therefore the DR is proportional to $$DR \propto V_{DD}^2 C \tag{14}$$

Therefore, to keep a constant DR during retargeting $$X_{SC} = \frac{C_{switched2}}{C_{switched1}} = \left(\frac{1}{X_{DD}}\right)^2 \tag{15}$$

During circuit retargeting, one focus is to keep the same circuit performance of a given circuit (source circuit) in a given fabrication process (source technology) while trying to migrate it (target circuit) to a different fabrication process (target technology). This may be done hierarchically. Each block is handled separately in a specific order. Naturally, if the performance of each block is kept the same during design migration, the performance of the whole macro-function will also be the same.

Equation (12) suggests that the ratio of bias currents in the two circuits should be kept the same as that of load capacitances. This allows to respect the same non-linear circuit performance as indicated by equation (6), and in the same time determines a design parameter of the target design in a direct and fast way.

Identical linear performance can be obtained by ensuring identical transfer function gain and poles/zeros. A first-order analysis (equations (1) to (3)) shows that all of these parameters depend on the ratio between small-signal parameters such as the transistor transconductance ($g_m$) and the transistor output conductance ($g_{ds}$) from one side and parasitic capacitances $C_P$ and the load capacitance $C_L$ from the other side. All of the previous parameters can be made proportional to the bias current (e.g. see equations (4) and (5)). This suggests that if equation (12) is satisfied, and that transistors are resized for the new current, identical linear performance should follow systematically.

For initialization, the main design variables in any circuit are branch currents, node voltages and transistor dimensions. Initial values for these quantities are found as follows:

All branch currents are determined by multiplying the source design branch currents by $X_I$ (given by equation (12)) set by the load capacitance ratio. Current values are then fixed throughout the whole process.

Node voltages (other than those of type F) are initialized through scaling the source circuit node voltages by $X_{DD}$ given by equation (9).

An initial solution for all transistor dimensions is obtained through scaling the source transistor sizes by $X_L$ given by equation (10).

Resizing is performed for each sub-circuit. Each transistor is then treated separately. Having calculated the bias current in all transistors during the initialization phase, we are left with transistor dimensions and terminal voltages to be determined. Current values are held constant throughout the retargeting process. The relative bias point should be kept the same. A simple optimization procedure usually suffices to adjust the relative bias point of the transistor under consideration subject to constant current. Transistor sizes are then chosen to match all transistor small-signal parameters. By fixing both the bias current and the relative bias point, small-signal parameter matching becomes a relatively easy task, which only consists of compensating second-order effects of transistor modeling not predicted by the first-order analysis.

During this process, optimization targets differ for different small signal parameters:

Small-signal conductances are adjusted with certain priorities according to the function of the transistor. Transistor functionality is recognized based on the block recognition step. For example, for transistors constituting differential pairs and current mirrors, priority is given to the gate transconductance $g_m$ followed by the output conductance $g_{ds}$, while for transistors acting as switches only the channel conductance is optimized.

Small-signal capacitances are limited during optimization to values smaller than or equal to corresponding capacitances in the original circuit.

Noise puts additional constraint on transistor dimensions. Flicker noise puts a lower limit on transistor area as shown from equation (7). Thermal noise is directly related to transistor transconductance as shown in equation (8), which is already optimized as described above. In general, noise has a higher priority in optimization for transistors connected to sub-circuit inputs.

The order by which transistors are treated depends on the number of nodes with fixed voltages. Transistors connected to the maximum number of fixed nodes are handled first. After the calculation of the relative bias point, it is a simple task to deduce the absolute node voltages of the non-fixed nodes. Once a node voltage is determined, it becomes fixed for following transistors.

The retargeting procedure usually results in circuits whose performance is very close to original ones. However, usually experienced designers want to have full control on the design under consideration, to tune the circuit to their application, to optimize the new design and fully exploit new fabrication process advantages. With today's complicated transistor models, it is becoming a tedious task to try to adjust small-signal parameters using first-order equations employed for hand calculations, in order to fine-tune the obtained performance. The above algorithm can be easily guided to the very most detail of the design using the designer directives. The designer directives can be used to alter any transistor design parameter of the original design. This allows the experienced designer to test different design options in a relatively small amount of time by running the algorithm many times and analyzing results.

Having illustrated and described the principles of the illustrated embodiments, it will be apparent to those skilled in the art that the embodiments can be modified in arrangement and detail without departing from such principles.

Although transistors, resistors, and capacitors are described, it can be expanded to other circuit devices, such as inductors.

Additionally, it will be recognized by those skilled in the art that the user can modify the scaling factor to any desired value in order to scale the current in the target design.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

The invention claimed is:

1. A method of converting an analog circuit from a source technology to a target technology, comprising:
   receiving the analog circuit in the source technology;
   converting the analog circuit from the source technology to the target technology by analyzing the analog circuit at a device level and resizing the analog circuit at the device level based on results of the analyzing; wherein the converting is performed by a computer and
   outputting the analog circuit in the target technology;
   wherein the analyzing the analog circuit at the device level comprises:
     determining whether a first transistor is in an off mode;
     if the first transistor is not off, analyzing the first transistor;
     if the first transistor is off, analyzing a second transistor symmetrical to the first transistor and propagating results of analyzing the second transistor to the first transistor.

2. The method of claim 1, wherein the analyzing the analog circuit at the device level comprises determining a mode of operation for a transistor in the analog circuit and resizing of the transistor based on the determined mode of operation.

3. The method of claim 2, wherein the resizing transistor comprises checking that changes to output conductance and parasitic capacitance of the resized transistor remain within a certain accuracy limit.

4. The method of claim 1, wherein the analyzing the analog circuit at the-device level comprises determining node voltages coupled to a device and resizing of the device based on the determined node voltages.

5. The method of claim 1, wherein the analyzing the analog circuit at the-device level comprises analyzing individual electrical devices, which are one or more of the following types: transistors, resistors, and capacitors.

6. The method of claim 1, further comprising performing a dc simulation of the analog circuit in the source technology to determine electrical parameters of the analog circuit and wherein the resizing is based on the determined electrical parameters.

7. The method of claim 1, further comprising:
   associating transistors with the circuit blocks; and
   selecting a transistor to resize based, in part, on the circuit blocks.

8. The method of claim 1, wherein analyzing the analog circuit comprises analyzing node voltages coupled to a resistor and resizing the resistor based on the node voltages.

9. The method of claim 1, further comprising receiving, on a server computer, a circuit description from a client computer over a distributed network, resizing the description on the server computer, and returning results of the resizing to the client computer over the distributed network.

10. A circuit retargeting system to convert an analog circuit from a source technology to a target technology, comprising:
    a design extraction engine that determines electrical parameters associated with the analog circuit;
    a resizing engine coupled to the design extraction engine that resizes individual devices within the analog circuit using the determined electrical parameters to convert the analog circuit from the source technology to the target technology; and
    an optimization engine coupled to the resizing engine, the optimization engine further changing the resized analog circuit taking into account timing issues and constraints.

11. The circuit retargeting system of claim 10, further comprising a simulator coupled to the design extraction engine used to obtain the electrical parameters, comprising voltage levels on nodes within the analog circuit.

12. The circuit retargeting system of claim 10, further comprising a source technology parameter database and a target technology parameter database both coupled to the resizing engine.

13. The circuit retargeting system of claim 10, further comprising a network comprising a client computer coupled to a server computer and wherein the circuit retargeting system is distributed over the network.

14. The circuit retargeting system of claim 13, wherein the server computer receives the analog circuit in the source technology, resizes the analog circuit to the target technology, and sends the resized circuit to the client computer.

15. The analog circuit retargeting system of claim 10, wherein the circuit is converted from the source technology to the target technology without any performance evaluation of the overall circuit.

16. A circuit retargeting system to convert an analog circuit from a source technology to a target technology, comprising:

means for receiving the analog circuit in the source technology;

means for converting the analog circuit from the source technology to the target technology by analyzing the analog circuit at device level and resizing the analog circuit at the device level insert using electrical parameters thereof and based on results of the analyzing;

means for outputting the analog circuit in the target technology; and means for optimization coupled to the means for converting for further changing the resized analog circuit taking into account timing issues and constraints.

* * * * *